(12) United States Patent
Yun et al.

(10) Patent No.: US 11,038,068 B2
(45) Date of Patent: Jun. 15, 2021

(54) SENSORS AND ELECTRONIC DEVICES

(71) Applicant: Samsung Electronics Co., Ltd., Suwon-si (KR)

(72) Inventors: Sung Young Yun, Suwon-si (KR); Kyung Bae Park, Hwaseong-si (KR); Sung Jun Park, Yongin-si (KR); Gae Hwang Lee, Seongnam-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/512,525

(22) Filed: Jul. 16, 2019

(65) Prior Publication Data

US 2020/0135945 A1    Apr. 30, 2020

(30) Foreign Application Priority Data

Oct. 31, 2018    (KR) ........................ 10-2018-0132321

(51) Int. Cl.
*H01L 31/0224*    (2006.01)
*H01L 27/146*    (2006.01)
*H01L 51/44*    (2006.01)
*H01L 27/30*    (2006.01)

(52) U.S. Cl.
CPC ............. *H01L 31/022408* (2013.01); *H01L 27/1463* (2013.01); *H01L 27/14643* (2013.01); *H01L 31/022466* (2013.01); *H01L 27/307* (2013.01); *H01L 51/442* (2013.01)

(58) Field of Classification Search
CPC ......... H01L 31/022408; H01L 27/1463; H01L 27/14643; H01L 31/022466; H01L 27/307
See application file for complete search history.

(56) References Cited

U.S. PATENT DOCUMENTS

| 7,667,750 B2 | 2/2010 | Goto et al. |
| 7,795,592 B2 | 9/2010 | Imai et al. |
| 8,368,058 B2 | 2/2013 | Sawaki et al. |
| 2007/0030221 A1* | 2/2007 | Pak ...................... G02F 1/13338 345/87 |
| 2016/0099430 A1* | 4/2016 | Kim ...................... H01L 27/307 257/40 |

FOREIGN PATENT DOCUMENTS

| JP | 2013161882 A | 8/2013 |
| KR | 20160039974 A | 4/2016 |

* cited by examiner

*Primary Examiner* — Marc Anthony Armand
(74) *Attorney, Agent, or Firm* — Harness, Dickey & Pierce, P.L.C.

(57) ABSTRACT

A photoelectric conversion device may include one or more pixel electrodes and an opposed electrode and a photoelectric conversion layer between the one or more pixel electrodes and the opposed electrode. The photoelectric conversion layer may be configured to absorb light of at least one part in a wavelength spectrum and to convert the absorbed light into an electrical signal. Each pixel electrode has an upper surface facing the photoelectric conversion layer, a side surface, and a non-angulated edge where the upper surface and the side surface meet.

19 Claims, 6 Drawing Sheets

SENSORS AND ELECTRONIC DEVICES

CROSS-REFERENCE TO RELATED APPLICATION

This application claims priority to and the benefit of Korean Patent Application No. 10-2018-0132321 filed in the Korean Intellectual Property Office on Oct. 31, 2018, the entire contents of which are incorporated herein by reference.

BACKGROUND

1. Field

Sensors and electronic devices are disclosed.

2. Description of the Related Art

Digital cameras and camcorders include sensors that capture images and store them as electrical signals. The sensors may include image sensors that divide incident light according to wavelengths and convert each divided component of the incident into separate electrical signals. The sensors may be usefully used as biometric sensors in recent years.

Sensors such as image sensors or biometric sensors may be down-sized as a time goes by. In recent years, sensors having a laminated structure have been studied to reduce sizes of the sensors.

SUMMARY

Some example embodiments provide a sensor capable of improving sensitivity by decreasing a dark current in a sensor having a laminated structure.

Some example embodiments provide an electronic device including the sensor.

According to some example embodiments, a sensor may include a photoelectric conversion device. The photoelectric conversion device may include a plurality of pixel electrodes, an opposed electrode, and a photoelectric conversion layer between the opposed electrode and the plurality of pixel electrodes. The photoelectric conversion layer may be configured to absorb light of at least one part in a wavelength spectrum and to convert the absorbed light into an electrical signal. Each pixel electrode of the plurality of pixel electrodes may have an upper surface facing the photoelectric conversion layer, a side surface, and a non-angulated upper edge where the upper surface and the side surface meet.

The non-angulated upper edge of the pixel electrode may be round, curved, or bent.

At least one part of the non-angulated upper edge of the pixel electrode may have a curvature radius satisfying the following relationship equation, $$\frac{r}{d} \leq 0.5 \qquad \text{[Relationship Equation]}$$

wherein, in the relationship equation, d is a thickness of the pixel electrode, and r is a curvature radius of the non-angulated upper edge of the pixel electrode.

At least one part of the non-angulated upper edge of the pixel electrode may have a curvature radius of about 1 nm to about 50 nm.

At least one part of the non-angulated upper edge of the pixel electrode may have a curvature radius of about 1 nm to about 20 nm.

Each pixel electrode of the plurality of pixel electrodes may have a lower surface facing the upper surface, and the lower surface of the pixel electrode may extend substantially perpendicular to the side surface of the pixel electrode.

An area of the photoelectric conversion layer overlapping with the upper surfaces of the plurality of pixel electrodes in a vertical direction extending substantially perpendicular to the upper surfaces of the plurality of pixel electrodes may be smaller than an area of the photoelectric conversion layer overlapping with the lower surface of the pixel electrodes in the vertical direction.

The plurality of pixel electrodes may include a first pixel electrode and a second pixel electrode, the first pixel electrode and the second pixel electrode adjacent to each other, and the sensor may further include an insulator between the first pixel electrode and the second pixel electrode.

The sensor may further include an insulator between non-angulated upper edges of the plurality of pixel electrodes and the photoelectric conversion layer.

Each pixel electrode of the plurality of pixel electrodes may be a transparent electrode.

The photoelectric conversion layer may be configured to selectively absorb, and convert into an electrical signal, light in a green wavelength spectrum, light in a blue wavelength spectrum, light red wavelength spectrum, light in an infrared wavelength spectrum, light in an ultraviolet wavelength spectrum, or any combination thereof.

The sensor may further include a semiconductor substrate stacked on the photoelectric conversion device in a vertical direction extending substantially perpendicular to the upper surfaces of the plurality of pixel electrodes.

The sensor may further include an insulation layer between the photoelectric conversion device and the semiconductor substrate.

An electronic device may include the sensor.

According to some example embodiments, a photoelectric conversion device may include a pixel electrode having a non-angulated upper edge, an opposed electrode facing the pixel electrode, and a photoelectric conversion layer between the pixel electrode and the opposed electrode.

The non-angulated upper edge of the pixel electrode may be round, curved, or bent.

At least one part of the non-angulated upper edge of the pixel electrode may have a curvature radius satisfying the following relationship equation, $$\frac{r}{d} \leq 0.5 \qquad \text{[Relationship Equation]}$$

wherein, in the relationship equation, d is a thickness of the pixel electrode, and r is a curvature radius of the non-angulated upper edge of the pixel electrode.

At least one part of the non-angulated upper edge of the pixel electrode may have a curvature radius of about 1 nm to about 50 nm.

At least one part of the non-angulated upper edge of the pixel electrode may have a curvature radius of about 1 nm to about 20 nm.

An electronic device may include the photoelectric conversion device.

DETAILED DESCRIPTION

Figure 1:
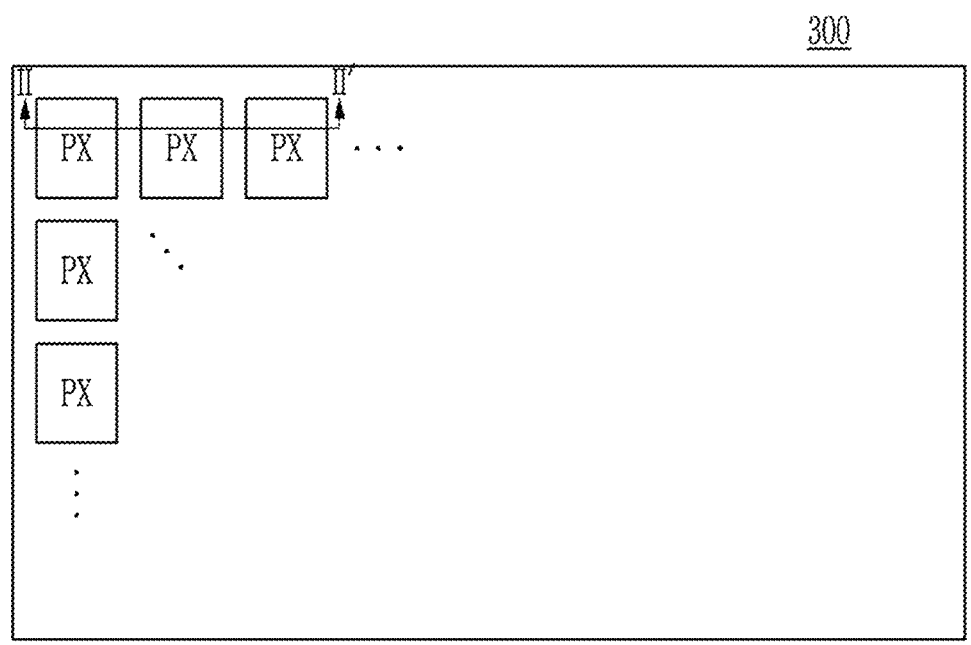
FIG. 1 is a schematic diagram showing a pixel arrangement of a sensor according to some example embodiments.

Example embodiments will hereinafter be described in detail, and may be easily performed by a person having an ordinary skill in the related art. However, this disclosure may be embodied in many different forms and is not to be construed as limited to the exemplary embodiments set forth herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, sensors according to some example embodiments is described.

The sensor may be a sensor that senses light and converts it into an electrical signal, for example, an image sensor, an infrared sensor, or a biometric sensor, and may be an organic sensor including, for example, organic material.

Figure 2:
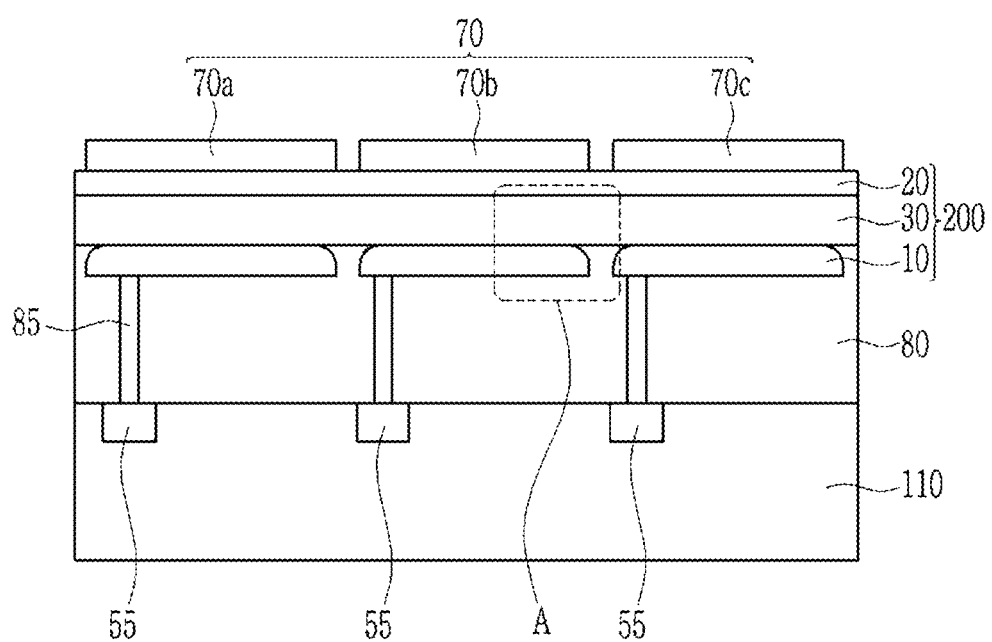
FIG. 2 is a cross-sectional view showing one example of the sensor of FIG. 1 taken along the II-II' line of FIG. 1.

FIG. 1 is a schematic diagram showing a pixel arrangement of a sensor according to some example embodiments and FIG. 2 is a cross-sectional view showing one example of the sensor of FIG. 1 taken along the II-II line.

Referring to FIG. 1, a sensor 300 according to some example embodiments may have a matrix format arrangement of a plurality of pixels (PX) wherein the pixels are repetitively arranged along a column and a raw. However, this pixel arrangement is not limited thereto but may be variously modified.

Referring to FIG. 2, a sensor 300 according to some example embodiments includes a semiconductor substrate 110 and a photoelectric conversion device 200. The semiconductor substrate 110 and the photoelectric conversion device 200 are stacked with each other in a vertical direction extending perpendicular or substantially perpendicular (e.g., perpendicular within manufacturing tolerances and/or material tolerances) to the upper surfaces 10a of the plurality of pixel electrodes 10.

The semiconductor substrate 110 may be for example a silicon substrate and may be integrated with a transmission transistor (not shown) and a charge storage 55. The transmission transistor and/or the charge storage 55 may be integrated in each pixel (PX).

A metal wire (not shown) and a pad (not shown) may be formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The photoelectric conversion device 200 includes a photoelectric conversion layer 30, a pixel electrode 10, and an opposed electrode 20.

The photoelectric conversion layer 30 may absorb light in at least one part in a wavelength spectrum and may convert the absorbed light into an electrical signal, and for example light in a green wavelength spectrum (hereinafter, referred to as 'green light'), light in a blue wavelength spectrum (hereinafter, referred to as 'blue light'), light in a red wavelength spectrum (hereinafter, referred to as 'red light'), light in an infrared wavelength spectrum (hereinafter, referred to as 'infrared light'), light in an ultraviolet wavelength spectrum (hereinafter, referred to as 'ultraviolet light'), or any combination thereof into an electrical signal.

For example, the photoelectric conversion layer 30 may be configured to selectively absorb the green light, the blue light, the red light, the infrared light, the ultraviolet light, or any combination thereof. Herein, the selective absorption of at least one from the green light, the blue light, the red light, and the infrared light means that an absorption spectrum thereof has a peak absorption wavelength (λmax) in one range among the ranges of about 500 to about 600 nm, greater than or equal to about 380 nm and less than about 500 nm, greater than about 600 nm and less than or equal to about 700 nm, and greater than about 700 nm and is remarkably higher (e.g., greater than or equal to about 80%, greater than or equal to about 90%, greater than or equal to about 95%, greater than or equal to about 98%, or greater than or equal to about 99%) in a corresponding wavelength spectrum than in the other wavelength spectrums.

The photoelectric conversion layer 30 may include at least one p-type semiconductor and at least one n-type semiconductor which form a pn junction and may produce excitons by receiving light from outside and then separate the produced excitons into holes and electrons.

The p-type semiconductor and the n-type semiconductor may be independently light-absorbing materials, and for example the p-type semiconductor, the n-type semiconductor, or both the p-type semiconductor and the n-type semiconductor may be an organic light-absorbing material. For example, the p-type semiconductor, the n-type semiconductor, or both the p-type semiconductor and the n-type semiconductor may be a wavelength-selective light absorbing material that selectively absorbs light in a particular (or, alternatively, predetermined) wavelength spectrum, and for example the p-type semiconductor, the n-type semiconductor, or both the p-type semiconductor and the n-type semiconductor may be a wavelength-selective organic light absorbing material. The p-type semiconductor and the n-type semiconductor may have a peak absorption wavelength (λmax) in the same wavelength spectrum or in a different wavelength spectrum.

The p-type semiconductor, the n-type semiconductor, or both the p-type semiconductor and the n-type semiconductor may be for example fullerene or a fullerene derivative, but is not limited thereto.

The photoelectric conversion layer 30 may be an intrinsic layer (an I layer) wherein the p-type semiconductor and the n-type semiconductor are mixed as a bulk heterojunction. Herein, the p-type semiconductor and the n-type semiconductor may be mixed in a volume ratio of about 1:9 to about 9:1, within the range, for example, in a volume ratio of about 2:8 to about 8:2, about 3:7 to about 7:3, about 4:6 to about 6:4, or about 5:5.

The photoelectric conversion layer 30 may be a bilayer including a p-type layer including the p-type semiconductor and an n-type layer including the n-type semiconductor.

Herein, a ratio of the thicknesses of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 30 may further include a p-type layer and/or an n-type layer in addition to the intrinsic layer. The p-type layer may include the p-type semiconductor and the n-type layer may include the n-type semiconductor. For example, the photoelectric conversion layer 30 may include in various combinations of p-type layer/I layer, I layer/n-type layer, p-type layer/I layer/n-type layer, and the like.

One of the pixel electrode 10 and the opposed electrode 20 may be an anode and the other may be a cathode. For example, the pixel electrode 10 may be a cathode and the opposed electrode 20 may be an anode. For example, the pixel electrode 10 may be an anode and the opposed electrode 20 may be a cathode.

The pixel electrode 10, the opposed electrode 20, or both the pixel electrode 10 and the opposed electrode 20 may be a transparent electrode, and for example each of the pixel electrode 10 and the opposed electrode 20 may be a transparent electrode. Herein, light transmittance of the transparent electrode may be for example greater than or equal to about 80%, for example greater than or equal to about 85%. The transparent electrode may be for example made of a transparent conductive oxide such as indium tin oxide (ITO), indium zinc oxide (IZO), zinc tin oxide (ZTO), aluminum tin oxide (AITO), and aluminum zinc oxide (AZO), or may be a metal thin layer having a thin thickness of several nanometers or several tens of nanometers or a metal thin layer of a monolayer or a plural layer having a thin thickness of several nanometers to several tens of nanometers doped with a metal oxide.

The pixel electrode 10 may independently be disposed in each pixel (PX) and the opposed electrode 20 may be a common electrode formed at an entire surface.

Hereinafter, the pixel electrode 10 is specifically described.

Figure 3:
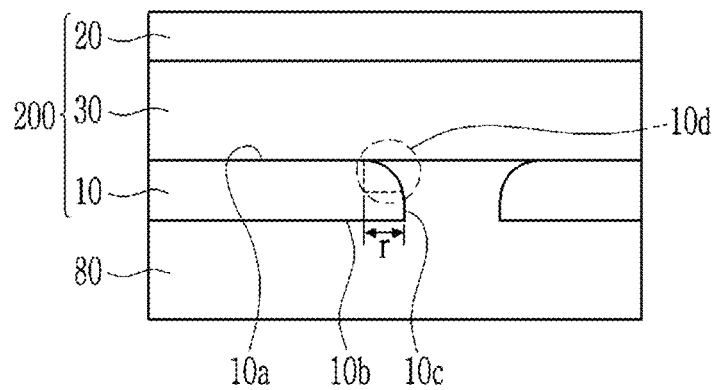
FIG. 3 is an enlarged schematic view of the "A" region of the sensor shown in FIG. 2.

FIG. 3 is an enlarged schematic view of the "A" region of the sensor shown in FIG. 2.

Referring to FIG. 3, the pixel electrode 10 includes an upper surface 10a disposed adjacent to the photoelectric conversion layer 30; a lower surface 10b facing the upper surface 10a (e.g., opposing the upper surface 10a) and being in contact with the insulating layer 80; a side surface 10c; and an upper edge 10d where the upper surface 10a and the side surface 10c meet.

The upper edge 10d of the pixel electrode 10 may be non-angulated and may be, for example, stout or smooth. The upper edge 10d of the pixel electrode 10 may be for example round, curved, or bent.

For example, a geometry of the upper edge 10d of the pixel electrode 10 may be represented by a particular (or, alternatively, predetermined) edge curvature, the curvature radius may be one or greater than or equal to two depending upon the geometry of the upper edge 10d. For example, at least one part of the edge 10d of the pixel electrode 10 may have an edge curvature satisfying the following relationship equation.

$$\frac{r}{d} \leq 0.5 \quad \text{[Relationship Equation]}$$

In the relationship equation,
d is a thickness of a pixel electrode 10, and
r is a curvature radius of the upper edge 10d of the pixel electrode 10.

For example, at least one part of the upper edge 10d of the pixel electrode 10 may have a curvature radius of about 1 nm to about 50 nm, for example a curvature radius of about 1 nm to about 30 nm or a curvature radius of about 1 nm to about 20 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described above, as the upper edge 10d of the pixel electrode 10 facing the photoelectric conversion layer 30 has a non-angulated shape, the edge area of the pixel electrode 10 where the electric field is focused to be reduced or blocked, so that the dark current of the sensor may be effectively reduced or prevented to improve a sensitivity of the sensor.

When the pixel electrode 10 has a plate shape that the upper surface 10a of the pixel electrode 10 is met in perpendicular or substantially perpendicular (e.g., perpendicular within manufacturing tolerances and/or material tolerances) to the side surface 10c of the pixel electrode 10, the electric field affecting on the upper surface 10a of the pixel electrode 10 is different from the electric field affecting on the upper edge 10d of the pixel electrode 10, so the upper edge 10d where the electric field is focused acts as a source generating dark current to rapidly increase the dark current of the sensor.

In some example embodiments, as the upper edge 10d of the pixel electrode 10 facing the photoelectric conversion layer 30 has a non-angulated shape, it may reduce an area where the electric field is focused in the edge of the pixel electrode 10, so that dark current of the sensor may be effectively reduced, and thus the sensitivity of the sensor may be improved.

For example, the electric field strength functioning on the upper edge 10d and the dark current thereof may be evaluated according to a curvature radius of the upper edge 10d of the pixel electrode 10. For example, the electric field strength may be calculated through the FDTD (finite-difference time-domain) mode simulation program COMSOL, supposed that the sensor includes a pixel electrode 10 including ITO and having a thickness of 50 nm, a photoelectric conversion layer 30 having a thickness of 100 nm, and a $SiO_2$ insulation layer 80. The dark current may be obtained from a current density corresponding to a voltage of the corresponding electric field from a dark J-V curve of the unit device (100 nm photoelectric conversion layer, 2 mm×2 mm area).

Figure 6:
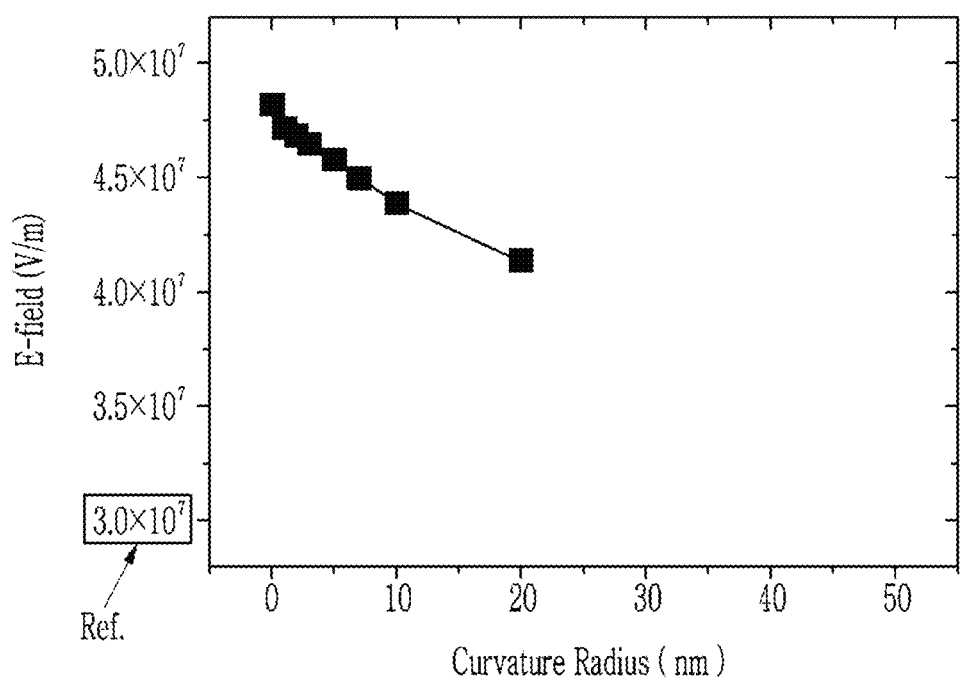
FIG. 6 is a graph showing an electric field strength acting on the edge depending on a curvature radius of the edge of the pixel electrode of the sensor according to one example.

The results are shown in FIG. 6 and Table 1.

FIG. 6 is a graph showing an electric field strength acting on the upper edge 10d of the pixel electrode 10 depending on a curvature radius (r) of the edge of the pixel electrode 10 of the sensor according to one example.

TABLE 1

| Curvature radius (r, nm) | Electric field strength (V/m) (@3 V) | Dark current (mA/cm$^2$) |
| --- | --- | --- |
| 0 | 4.82 × 10$^7$ | 4.63 × 10$^{-8}$ |
| 1 | 4.72 × 10$^7$ | 3.92 × 10$^{-8}$ |
| 2 | 4.69 × 10$^7$ | 3.72 × 10$^{-8}$ |
| 3 | 4.65 × 10$^7$ | 3.48 × 10$^{-8}$ |
| 5 | 4.58 × 10$^7$ | 3.10 × 10$^{-8}$ |
| 7 | 4.50 × 10$^7$ | 2.71 × 10$^{-8}$ |

TABLE 1-continued

| Curvature radius (r, nm) | Electric field strength (V/m) (@3 V) | Dark current (mA/cm$^2$) |
| --- | --- | --- |
| 10 | 4.39 × 10$^7$ | 2.26 × 10$^{-8}$ |
| 20 | 4.14 × 10$^7$ | 1.50 × 10$^{-8}$ |

Referring to FIG. 6 and Table 1, when the curvature radius of the upper edge 10d of the pixel electrode 10 is changed into about 1 nm to about 20 nm, the electric field strength working on the upper edge 10d is decreased according to increasing the curvature radius (r), so it is confirmed that the difference from the reference electric field (Ref., 3.0×10$^7$ V/m), which is an electric field strength working on the upper surface 10a of the pixel electrode 10, is reduced. In addition, it is also confirmed that the dark current of the sensor is decreased according to decreasing the electric field strength working on the upper edge 10d of the pixel electrode 10.

Meanwhile, the lower surface 10b of the pixel electrode 10 may extend perpendicular or substantially perpendicular (e.g., perpendicular within manufacturing tolerances and/or material tolerances) to the side surface 10c of the pixel electrode 10. But it is not limited thereto, and the lower surface 10b of the pixel electrode 10 and the side surface 10c of the pixel electrode 10 may be tapered in a particular (or, alternatively, predetermined) angle.

According to the shape of the pixel electrode 10, the upper surface 10a of the pixel electrode 10 may have an area different from an area of the lower surface 10b, for example, the area, in a horizontal direction extending parallel or substantially parallel (e.g., parallel within manufacturing tolerances and/or material tolerances) to the upper surfaces 10a of the plurality of pixel electrodes 10, of the region where the upper surface 10a of the pixel electrode 10 overlaps with the photoelectric conversion layer 30 in a vertical direction extending perpendicular or substantially perpendicular (e.g., perpendicular within manufacturing tolerances and/or material tolerances) to the upper surfaces 10a of the plurality of pixel electrodes 10 may be smaller than the area in the horizontal direction of the region where the lower surface 10b of the pixel electrode 10 overlaps with the photoelectric conversion layer 30 in the vertical direction.

The pixel electrode 10 may be formed by various methods. For example, a transparent conductive oxide or the like may be deposited and patterned, and then the edge may be processed with a laser or an electron beam to form a desired shape, may be formed by selectively polishing the surface of the electrode 10 to form a desired shape with chemical mechanical polishing (CMP), or may be formed with a diluted (e.g., about 1:10 to about 1:20 v/v) aqueous hydrofluoric acid (HF) solution, but is not limited thereto.

A charge auxiliary layer (not shown) may be further included between the pixel electrode 10 and the photoelectric conversion layer 30 and/or the opposed electrode 20 and the photoelectric conversion layer 30. The charge auxiliary layer may be for example a hole injection layer, a hole transport layer, an electron blocking layer, an electron injection layer, an electron transport layer, and/or a hole blocking layer, but is not limited thereto.

The photoelectric conversion device 200 may further include an anti-reflection layer (not shown) on one surface of the opposed electrode 20. The anti-reflection layer is disposed at a light incidence side and lowers reflectance of light of incident light and thereby light absorbance is further improved. The anti-reflection layer may include, for example a material having a refractive index of about 1.6 to about 2.5, and may include for example metal oxide, metal sulfide, an organic material having a refractive index within the ranges, or any combination thereof. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 200, when light enters from the opposed electrode 20 and the photoelectric conversion layer 30 absorbs light in a particular (or, alternatively, predetermined) wavelength spectrum, excitons may be produced thereinside. The excitons are separated into holes and electrons in the photoelectric conversion layer 30, and the separated holes are transported to an anode that is one of the pixel electrode 10 and the opposed electrode 20 and the separated electrons are transported to the cathode that is the other of the pixel electrode 10 and the opposed electrode 20 so as to flow a current.

The insulation layer 80 is disposed between the semiconductor substrate 110 and the photoelectric conversion device 200. The insulation layer 80 may include an insulator, for example an inorganic insulating material such as silicon oxide and/or silicon nitride or SiC, SiCOH, SiCO, and SiOF. The insulation layer 80 has a trench 85 exposing a charge storage 55 that will be described later. The trench 85 may be filled with fillers. The insulator of the insulation layer 80 may be filled in spaces between adjacent pixel electrodes 10 and in spaces between the upper edge 10d of the pixel electrode 10 and the photoelectric conversion layer 30. Restated, and as shown, the insulation layer 80 may provide an insulator that is between adjacent first and second pixel electrodes 10, and the insulation layer 80 may provide an insulator that is between non-angulated upper edges 10d of the plurality of pixel electrodes 10 and the photoelectric conversion layer 30.

A color filter layer 70 is formed on the photoelectric conversion device 200. The color filter layer 70 may include a first color filter 70a, a second color filter 70b, and a third color filter 70c selected from a blue filter, a red filter, a green filter, a cyan filter, a magenta filter, and a yellow filter. However, the first color filter 70a, the second color filter 70b, the third color filter 70c, or any combination thereof may not be included. The color filter layer 70 may not be included as needs.

Focusing lens (not shown) may be further formed on the color filter layer 70. The focusing lens may control a direction of incident light and gather the light in one region. The focusing lens may have a shape of, for example, a cylinder or a hemisphere, but is not limited thereto.

Figure 4:
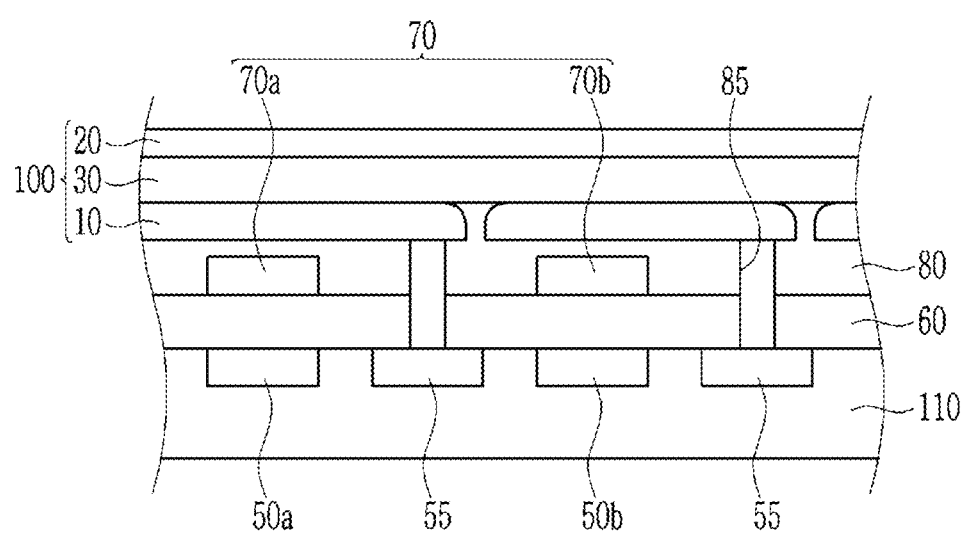
FIG. 4 is a cross-sectional view showing another example of the sensor of FIG. 1 taken along the II-II' line of FIG. 1.

FIG. 4 is a cross-sectional view showing another example of the sensor of FIG. 1 taken along the II-II' line of FIG. 1.

Referring to FIG. 4, a sensor according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric conversion device 200.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b sense light, the information sensed by the photo-sensing devices may be transferred by the transmission transistor, the charge storage 55 is electrically connected to the photoelectric conversion device 200 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing device 50a and 50b.

The lower insulation layer 60 is formed on the metal wire and the pad. The lower insulation layer 60 may be made of an inorganic insulating material such as silicon oxide and/or silicon nitride, or a low dielectric constant (low K) material such as SiC, SiCOH, SiCO, and SiOF. The lower insulation layer 60 has a trench 85 exposing the charge storage 55. The trench 85 may be filled with fillers.

A color filter layer 70 is formed on the lower insulation layer 60. The color filter layer 70 includes a first color filter 70a and a second color filter 70b. The first color filter 70a and the second color filter 70b may be independently one of a blue filter, a red filter, a green filter, a cyan filter, a magenta filter, and a yellow filter. The color filter layer 70 may further include a third color filter that is different from the first color filter 70a and the second color filter 70b. For another example, the color filter layer 70 may be disposed on the photoelectric conversion device 200.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and the trench 85 exposing the charge storage 55 of the green pixel.

The photoelectric conversion device 200 is formed on the upper insulation layer 80.

As described above, the photoelectric conversion device 200 includes the pixel electrode 10, the photoelectric conversion layer 30, and the opposed electrode 20. Details therefor are the same as described above.

Figure 5:
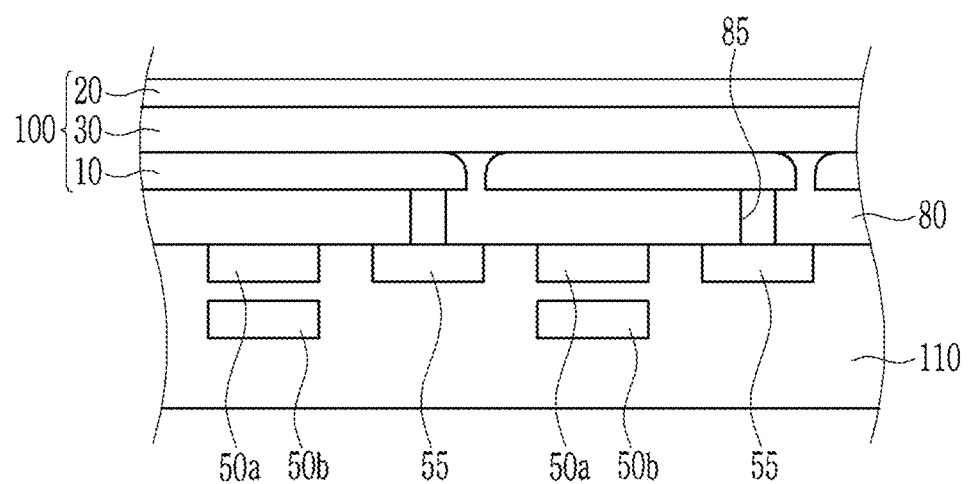
FIG. 5 is a cross-sectional view showing another example of the sensor of FIG. 1 taken along the II-II' line of FIG. 1.

FIG. 5 is a cross-sectional view showing another example of the sensor of FIG. 1 taken along the II-II' line of FIG. 1.

Referring to FIG. 5, a sensor according to some example embodiments includes a semiconductor substrate 110 integrated with photo-sensing devices 50a and 50b, a transmission transistor (not shown), and a charge storage 55, an insulation layer 80 having a trench 85, and a photoelectric conversion device 200, like some example embodiments.

However, in the sensor according to some example embodiments, the photo-sensing devices 50a and 50b are laminated in a vertical direction, but the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength spectrum depending on a lamination depth.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A sensor, comprising:
a photoelectric conversion device, the photoelectric conversion device including a plurality of pixel electrodes, an opposed electrode, and a photoelectric conversion layer between the opposed electrode and the plurality of pixel electrodes, the photoelectric conversion layer configured to absorb light of at least one part in a wavelength spectrum and to convert the absorbed light into an electrical signal,
wherein each pixel electrode of the plurality of pixel electrodes is a transparent electrode and has
an upper surface facing the photoelectric conversion layer,
a side surface, and
a non-angulated upper edge where the upper surface and the side surface meet.

2. The sensor of claim 1, wherein the non-angulated upper edge of the pixel electrode is round, curved, or bent.

3. The sensor of claim 1, wherein at least one part of the non-angulated upper edge of the pixel electrode has a curvature radius satisfying the following relationship equation, $$\frac{r}{d} \leq 0.5 \qquad \text{[Relationship Equation]}$$

wherein, in the relationship equation,
d is a thickness of the pixel electrode, and
r is a curvature radius of the non-angulated upper edge of the pixel electrode.

4. The sensor of claim 3, wherein at least one part of the non-angulated upper edge of the pixel electrode has a curvature radius of about 1 nm to about 50 nm.

5. The sensor of claim 3, wherein at least one part of the non-angulated upper edge of the pixel electrode has a curvature radius of about 1 nm to about 20 nm.

6. The sensor of claim 1, wherein
each pixel electrode of the plurality of pixel electrodes has a lower surface facing the upper surface, and
the lower surface of the pixel electrode extends substantially perpendicular to the side surface of the pixel electrode.

7. The sensor of claim 6, wherein an area of the photoelectric conversion layer overlapping with the upper surfaces of the plurality of pixel electrodes in a vertical direction extending substantially perpendicular to the upper surfaces of the plurality of pixel electrodes is smaller than an area of the photoelectric conversion layer overlapping with the lower surfaces of the plurality of pixel electrodes in the vertical direction.

8. The sensor of claim 1, wherein
the plurality of pixel electrodes include a first pixel electrode and a second pixel electrode, the first pixel electrode and the second pixel electrode adjacent to each other, and
the sensor further includes an insulator between the first pixel electrode and the second pixel electrode.

9. The sensor of claim 1, further comprising:
an insulator between non-angulated upper edges of the plurality of pixel electrodes and the photoelectric conversion layer.

10. The sensor of claim 1, wherein the photoelectric conversion layer is configured to selectively absorb, and convert into the electrical signal, light in a green wavelength spectrum, light in a blue wavelength spectrum, light red wavelength spectrum, light in an infrared wavelength spectrum, light in an ultraviolet wavelength spectrum, or any combination thereof.

11. The sensor of claim 1, further comprising:
a semiconductor substrate stacked on the photoelectric conversion device in a vertical direction extending substantially perpendicular to the upper surfaces of the plurality of pixel electrodes.

12. The sensor of claim 11, further comprising:
an insulation layer between the photoelectric conversion device and the semiconductor substrate.

13. An electronic device comprising the sensor of claim 1.

14. A photoelectric conversion device, comprising:
a pixel electrode having a non-angulated upper edge;
an opposed electrode facing the pixel electrode; and
a photoelectric conversion layer between the pixel electrode and the opposed electrode,
wherein the pixel electrode is a transparent electrode.

15. The photoelectric conversion device of claim 14, wherein the non-angulated upper edge of the pixel electrode is round, curved, or bent.

16. The photoelectric conversion device of claim 14, wherein at least one part of the non-angulated upper edge of the pixel electrode has a curvature radius satisfying the following relationship equation, $$\frac{r}{d} \leq 0.5 \qquad \text{[Relationship Equation]}$$

wherein, in the relationship equation,
d is a thickness of the pixel electrode, and
r is a curvature radius of the non-angulated upper edge of the pixel electrode.

17. The photoelectric conversion device of claim 16, wherein at least one part of the non-angulated upper edge of the pixel electrode has a curvature radius of about 1 nm to about 50 nm.

18. The photoelectric conversion device of claim 16, wherein at least one part of the non-angulated upper edge of the pixel electrode has a curvature radius of about 1 nm to about 20 nm.

19. An electronic device comprising the photoelectric conversion device of claim 14.

\* \* \* \* \*